United States Patent
Chang et al.

(10) Patent No.: US 9,425,218 B2
(45) Date of Patent: Aug. 23, 2016

(54) PIXEL STRUCTURE AND DISPLAY PANEL

(71) Applicant: AU Optronics Corporation, Hsin-Chu (TW)

(72) Inventors: Wan-Heng Chang, Hsin-Chu (TW); Hsiao-Wei Cheng, Hsin-Chu (TW); Shih-Chyuan Fan Jiang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 66 days.

(21) Appl. No.: 14/287,727

(22) Filed: May 27, 2014

(65) Prior Publication Data

US 2015/0124206 A1    May 7, 2015

(30) Foreign Application Priority Data

Nov. 5, 2013  (TW) .............................. 102140117 A (51) Int. Cl.
  *G02F 1/1343*   (2006.01)
  *H01L 27/12*    (2006.01)

(52) U.S. Cl.
  CPC ........ *H01L 27/124* (2013.01); *G02F 1/134363* (2013.01)

(58) Field of Classification Search
  CPC .......... G02F 1/134309; G02F 1/13351; G02F 1/133512
  USPC .................................. 349/139, 138, 141, 156
  See application file for complete search history.

(56) References Cited

U.S. PATENT DOCUMENTS 7,688,410 B2 *  3/2010  Kim ................... G02F 1/133555
                                                  349/114
7,839,462 B2   11/2010  Lin
2005/0078261 A1 *  4/2005  Ono ................... G02F 1/134363
                                                  349/141
2006/0279685 A1 * 12/2006  Hirakata ............... G02F 1/1334
                                                  349/141
2007/0070282 A1 *  3/2007  Shibahara ......... G02F 1/134363
                                                  349/141
2007/0273819 A1 * 11/2007  Kawasaki ......... G02F 1/134363
                                                  349/141
2010/0302492 A1 * 12/2010  Kubota ............. G02F 1/134363
                                                  349/138
2011/0128401 A1 *  6/2011  Choi ...................... G03B 17/20
                                                  348/222.1
2011/0304526 A1 * 12/2011  Itoh ................... G02F 1/133711
                                                  345/87
2012/0069283 A1 *  3/2012  Kizu ................. G02F 1/133707
                                                  349/141
2013/0148048 A1 *  6/2013  Hiratsuka ............. G02F 1/1343
                                                  349/38

FOREIGN PATENT DOCUMENTS

TW          201227115          7/2012

* cited by examiner

*Primary Examiner* — Sang V Nguyen
(74) *Attorney, Agent, or Firm* — WPAT, PC; Justin King (57) ABSTRACT

A pixel structure disposed on a first substrate is provided. The pixel structure includes a scan line, a data line, an active component, a pixel electrode, a first dielectric layer, a common electrode, and a protrusion. The scan line and the data line are disposed on the first substrate. The pixel electrode is disposed on the first substrate. The first dielectric layer is disposed on the first substrate and covers the pixel electrode. The common electrode is disposed on the first dielectric layer, and the common electrode has at least two first branched electrodes and a first opening between the first branched electrodes. The first branched electrodes and the first opening on the first substrate overlap with the pixel electrode in a projection direction. The protrusion is disposed on the first dielectric layer, and the protrusion is disposed in the first opening between the first branched electrodes.

15 Claims, 8 Drawing Sheets

PIXEL STRUCTURE AND DISPLAY PANEL

RELATED APPLICATIONS

This application claims priority to Taiwan Application Serial Number 102140117, filed Nov. 5, 2013, which are herein incorporated by reference.

BACKGROUND

A liquid crystal display (LCD) is a flat panel displaying device that is made up of a certain number of segments filled with liquid crystals and arrayed in front of a light source or a reflector to produce images in color or monochrome. Compared with traditional display based on like a cathode ray tube (CRT), the LCD is more energy efficient and safer and thus has become the mainstream in the market.

In a high-resolution liquid crystal panel, a common electrode and a pixel electrode form a capacitance. By the common electrode and the pixel electrode, electric fields are formed through a liquid crystal layer. Therefore, orientations of liquid crystal molecules are controlled by the electric fields, so as respective grayscales of the pixels. Enhancing a control efficiency of the common electrode and the pixel electrode to the liquid crystal layer is required to improve the performance in transmittance of the liquid crystal panel.

SUMMARY

This disclosure provides a pixel structure.

In one aspect of the disclosure, a pixel structure is provided. The pixel structure is disposed on a substrate. The pixel structure includes a scan line, a data line, an active component, a pixel electrode, a first dielectric layer, a common electrode, and at least one protrusion. The scan line and the data line are disposed on the substrate. The active component is electrically connected to the scan line and the data line. The pixel electrode is disposed on the substrate and is electrically connected to the active component. The first dielectric layer is disposed on the substrate and at least covers the pixel electrode. The common electrode is at least partially disposed on the first dielectric layer. The common electrode has at least two first branched electrodes and a first opening between the first branched electrodes, and the first branched electrodes and the first opening on the substrate at least partially overlap with the pixel electrode in a projection direction. The protrusion is disposed on the first dielectric layer. The protrusion is at least partially disposed in the first opening between the first branched electrodes.

In one or more embodiments, the protrusion has a bottom surface facing the first dielectric layer, a top surface opposite to the bottom surface, and a first inclined surface connected to the top surface and the bottom surface.

In one or more embodiments, at least a part of the first branched electrodes conformally covers the first inclined surface.

In one or more embodiments, at least a part of the first branched electrodes covers the first dielectric layer.

In one or more embodiments, a number of the protrusions is greater than two, at least one of the first branched electrodes is disposed between two of the protrusions neighboring to each other, and the first branched electrode disposed between the two of protrusions neighboring to each other conformally covers the first inclined surfaces of the two of the protrusions neighboring to each other and the first dielectric layer disposed between two of protrusions neighboring to each other.

In one or more embodiments, the common electrode further includes at least one second branched electrode disposed on the first dielectric layer, and the second branched electrode onto the substrate at least partially overlaps with the data line in the projection direction.

In one or more embodiments, the pixel structure further includes a patterned second dielectric layer. The patterned second dielectric layer is at least partially disposed between the data line and the first dielectric layer, such that a raised portion is formed on the first dielectric layer and that the second branched electrode at least partially covers the raised portion.

In one or more embodiments, the raised portion has at least one second inclined surface, and the second branched electrode at least partially covers the second inclined surface.

In one or more embodiments, the second inclined surface has a slope reciprocal, and the slope reciprocal is greater than 1.

In one or more embodiments, the pixel structure further includes a patterned second dielectric layer. The patterned second dielectric layer is disposed on the first dielectric layer and is at least partially disposed between the first dielectric layer and the second branched electrode.

In one or more embodiments, the patterned second dielectric layer has at least one second inclined surface, and the second branched electrode at least partially covers the second inclined surface.

In one or more embodiments, the first dielectric layer has at least one raised portion, the second branched electrode at least partially covers the raised portion, and the second branched electrode on the substrate at least partially overlap with the data line in the projection direction.

In one or more embodiments, the raised portion has at least one second inclined surface, and the second branched electrode at least partially covers the second inclined surface.

In one or more embodiments, a thickness of the first dielectric layer disposed beneath the second branched electrode is greater than a thickness of the first dielectric layer disposed beneath the first branched electrode.

In another aspect of the disclosure, a display panel is provided. The display panel includes a first substrate, a scan line, a data line, an active component, a pixel electrode, a first dielectric layer, a common electrode, at least one protrusion, a second substrate, and a display medium layer. The scan line is disposed on the first substrate. The data line is disposed on the first substrate. The active component is electrically connected to the scan line and the data line. The pixel electrode is disposed on the first substrate and is electrically connected to the active component. The first dielectric layer is disposed on the first substrate and at least covers the pixel electrode. The common electrode is at least partially disposed on the first dielectric layer. The common electrode has at least two first branched electrodes and a first opening between the first branched electrodes, and the first branched electrodes and the first opening onto the first substrate at least partially overlap with the pixel electrode in the projection direction. At least one protrusion is disposed on the first dielectric layer. The protrusion is at least partially disposed in the first opening between the first branched electrodes. The second substrate opposites to the first substrate. The display medium layer is disposed between the first substrate and the second substrate.

By disposing the protrusion between two of the first branched electrodes neighboring to each other, electric fields formed by the common electrode and the pixel electrode become twisted in the display medium layer, such that a control efficiency of the display medium layer is increased. In addition, by increasing the thickness of the dielectric layer between the second branched electrode and the data line without changing the thickness of the dielectric layer between the first branched electrode and the pixel electrode, an energy consumption of a source driver chip is decreased, and the control efficiency of the display medium layer does not decrease in the same time.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1A:
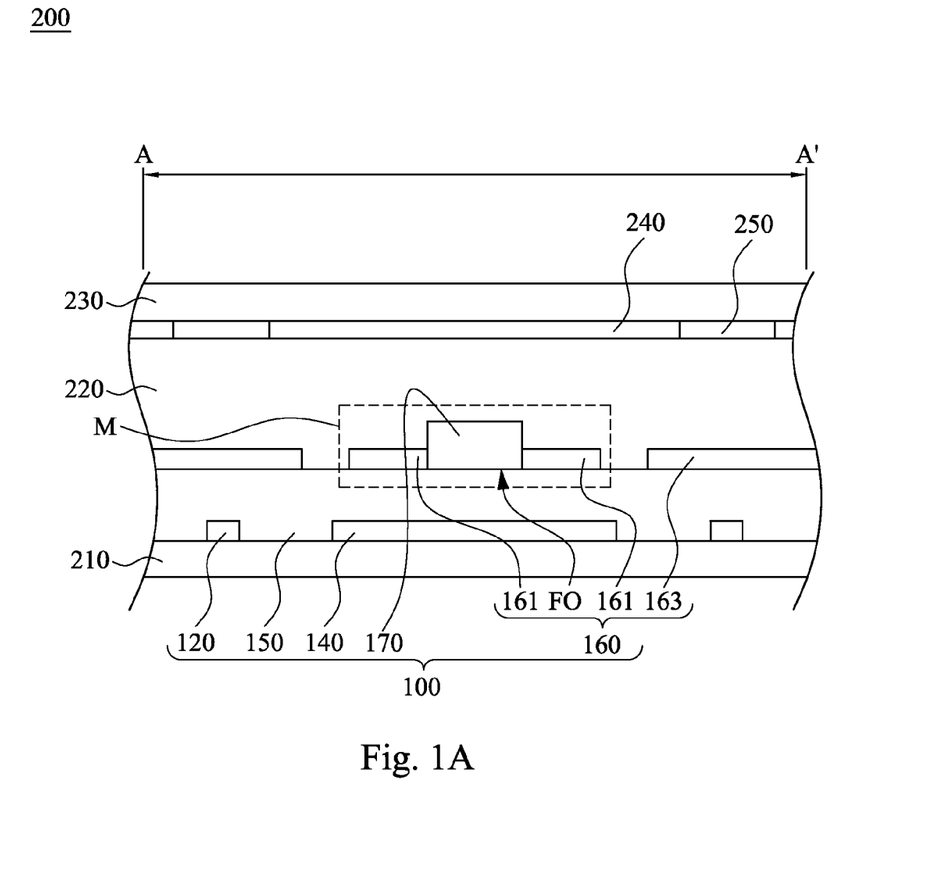
FIG. 1A is a cross-sectional view of a display panel according to one embodiment of this invention.
Figure 1B:
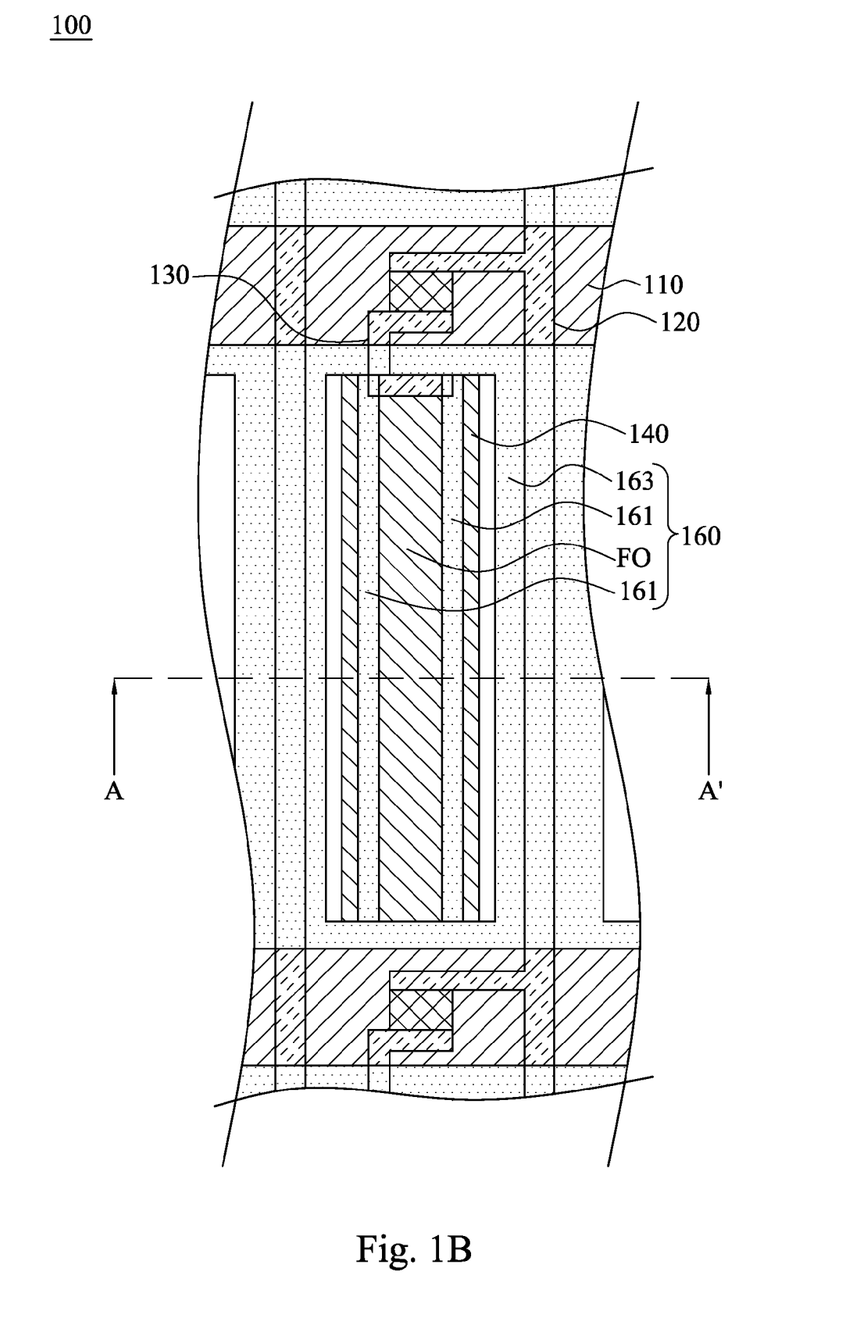
FIG. 1B is a schematic top view of a pixel structure of FIG. 1A.

FIG. 1A is a cross-sectional view of a display panel 200 according to one embodiment of this invention. FIG. 1B is a schematic top view of a pixel structure 100 of FIG. 1A. FIG. 1A is taken along segment A-A' of FIG. 1B.

As shown in FIG. 1A and FIG. 1B, a display panel 200 is provided. The display panel 200 includes a first substrate 210, a pixel structure 100, a display medium layer 220, and a second substrate 230. The pixel structure 100 is disposed on a first substrate 210. The pixel structure 100 includes a scan line 110, a data line 120, an active component 130, a pixel electrode 140, a first dielectric layer 150, a common electrode 160, and at least one protrusion 170. The scan line 110 is disposed on the first substrate 210. The data line 120 is disposed on the first substrate 210. The active component 130 is electrically connected to the scan line 110 and the data line 120. The pixel electrode 140 is disposed on the first substrate 210 and is electrically connected to the active component 130. The first dielectric layer 150 is disposed on the first substrate 210 and at least covers the pixel electrode 140. The common electrode 160 is at least partially disposed on the first dielectric layer 150. The common electrode 160 has at least two first branched electrodes 161 and a first opening FO between the first branched electrodes 161, and the first branched electrodes 161 and the first opening FO on the first substrate 210 at least partially overlap with the pixel electrode 140 in the projection direction. The protrusion 170 is disposed on the first dielectric layer 150. The protrusion 170 is at least partially disposed between two of the first branched electrodes 161 neighboring to each other. The second substrate 230 opposites to the first substrate 210. The display medium layer 220 is disposed between the first substrate 210 and the second substrate 230.

The display medium layer 220 can be a liquid crystal layer or an electrowetting material layer. People having ordinary skill in the art can make proper modification to the display medium layer 220 according to their actual needs.

Figure 2A:
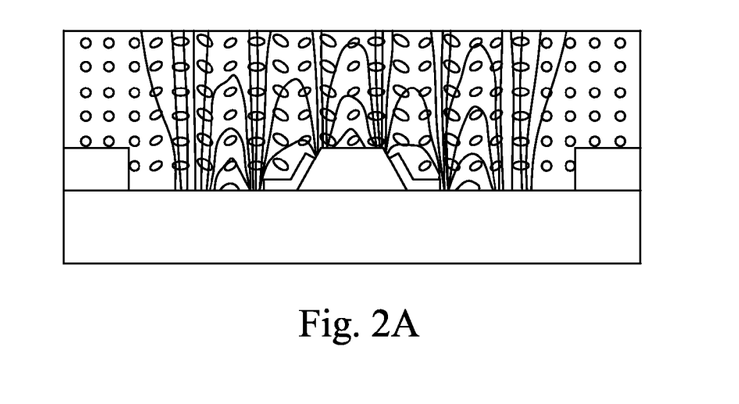
FIG. 2A is a simulated potential distribution in a liquid crystal layer when the pixel structure has a protrusion according to one embodiment of this invention.
Figure 2B:
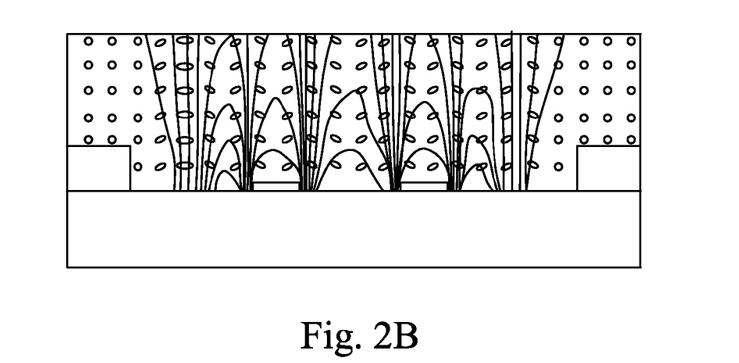
FIG. 2B is a simulated potential distribution in the liquid crystal layer when the pixel structure doesn't have the protrusion according to a comparative example.
Figure 3:
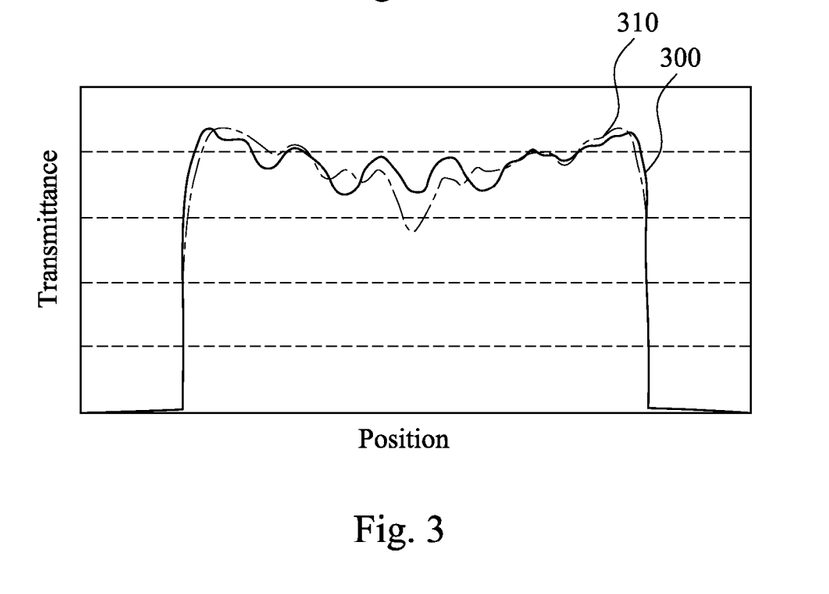
FIG. 3 is a transmittance to position figure of FIG. 2A and FIG. 2B.

FIG. 2A is a simulated potential distribution in the liquid crystal layer when the pixel structure has the protrusion according to one embodiment of this invention. FIG. 2B is a simulated potential distribution in the liquid crystal layer when the pixel structure doesn't have the protrusion according to a comparative example. FIG. 3 is a transmittance to position figure of FIG. 2A and FIG. 2B. In a liquid crystal display, if electric fields formed by the common electrode and the pixel electrode is more twisted in the liquid crystal layer, the electric fields have a stronger ability to twist liquid crystal molecules, so that the liquid crystal display has a better liquid crystal efficiency and thus a higher transmittance. As shown in FIGS. 2A and 2B, because the pixel structure of FIG. 2A has a protrusion, the potential distribution in FIG. 2A is more twisted than the potential distribution in FIG. 2B, and thus the electric fields in FIG. 2A have a better ability to twist liquid crystal molecules. Circles and ellipses in FIGS. 2A and 2B represent how much liquid crystal molecules are twisted, and liquid crystal molecules in FIG. 2A are more twisted than liquid crystal molecules in FIG. 2B. Therefore, as shown in FIG. 3, a curve 300 represents a transmittance when the pixel structure has the protrusion, and a curve 310 represents a transmittance when the pixel structure doesn't have the protrusion. The transmittance when the pixel structure has the protrusion is higher than the transmittance when the pixel structure doesn't the protrusion.

As shown in FIGS. 1A and 1B, the protrusion 170 can be disposed in the first opening FO. People having ordinary skill in the art can make proper modification to the position of the protrusion 170 according to their actual needs.

The display panel 200 can further includes a color filter layer 240 and a black matrix 250. The color filter layer 240 is disposed on a surface of the second substrate 230 facing the display medium layer 220 and corresponds to the pixel electrode 140. The black matrix 250 is disposed on a surface of the second substrate 230 facing the display medium layer 220 and is disposed on two opposite sides of the color filter layer 240.

In addition, the common electrode 160 further includes at least one second branched electrode 163. The second branched electrode 163 is disposed on the first dielectric layer 150, and the second branched electrode 163 on the first substrate 210 at least partially overlaps with the data line 120 in the projection direction. For avoiding light leakages in dark state due to signal interferences of the data line 120, the second branched electrode 163 is disposed above the data line 120, and electric fields generated by the data line 120 may be shielded.

Figure 4A:
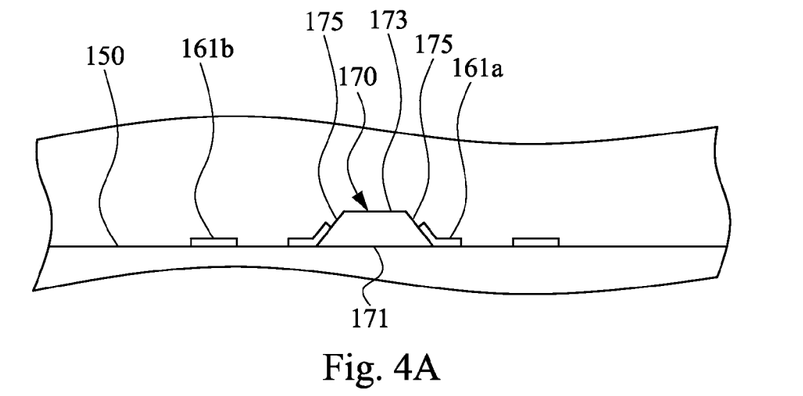
FIGS. 4A, 4B, and 4C are enlarged views of an area M of FIG. 1A according to different embodiments of this invention.
Figure 4B:
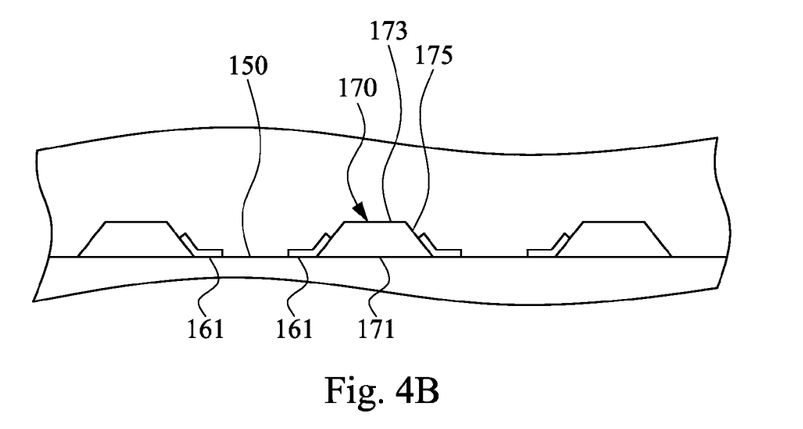
Figure 4C:
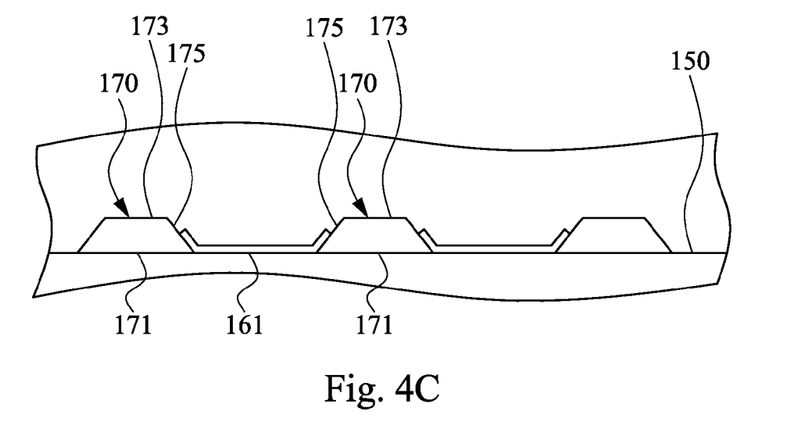

FIGS. 4A, 4B, and 4C are enlarged views of an area M of FIG. 1A according to different embodiments of this invention. As shown in FIGS. 4A, 4B, and 4C, the protrusion 170 has a bottom surface 171 facing the first dielectric layer 150, a top surface 173 opposite to the bottom surface 171, and a first inclined surface 175 connected to the top surface 173 and the bottom surface 171.

As shown in FIG. 4A, the aforementioned first branched electrodes 161 can be divided into two parts. The first part is the first branched electrodes 161a, and the second part is the first branched electrodes 161b. The first branched electrodes 161a conformally cover the first inclined surface 175. In other words, a part of each of the first branched electrodes 161a is disposed on the first inclined surface 175, and the other part of each of the first branched electrodes 161a is disposed on the first dielectric layer 150. The first branched electrodes 161b cover the first dielectric layer 150. In other words, each of the first branched electrodes 161b is entirely disposed on the first dielectric layer 150.

As shown in FIG. 4B, the first branched electrodes 161 all conformally cover the first inclined surface 175. In other words, a part of each of the first branched electrodes 161 is disposed on the first inclined surface 175, and the other part of each of the first branched electrodes 161 is disposed on the first dielectric layer 150.

As shown in FIG. 4C, a number of the protrusions 170 is greater than two, and at least one of the first branched electrodes 161 is disposed between two of the protrusions 170 neighboring to each other. The first branched electrode 161 disposed between the two of protrusions 170 neighboring to each other conformally covers the first inclined surfaces 175 of the two of the protrusions 170 neighboring to each other and the first dielectric layer 150 disposed between two of protrusions 170 neighboring to each other.

By the inclined structure of the protrusion 170 and the first branched electrode 161 conformally covering the first inclined surface 175, the electric fields formed by the first branched electrode 161 and the pixel electrode 140 become more twisted, such that the electric fields have a stronger ability to twist liquid crystal molecules and that the display panel 200 has a better liquid crystal efficiency and a higher transmittance.

Figure 5:
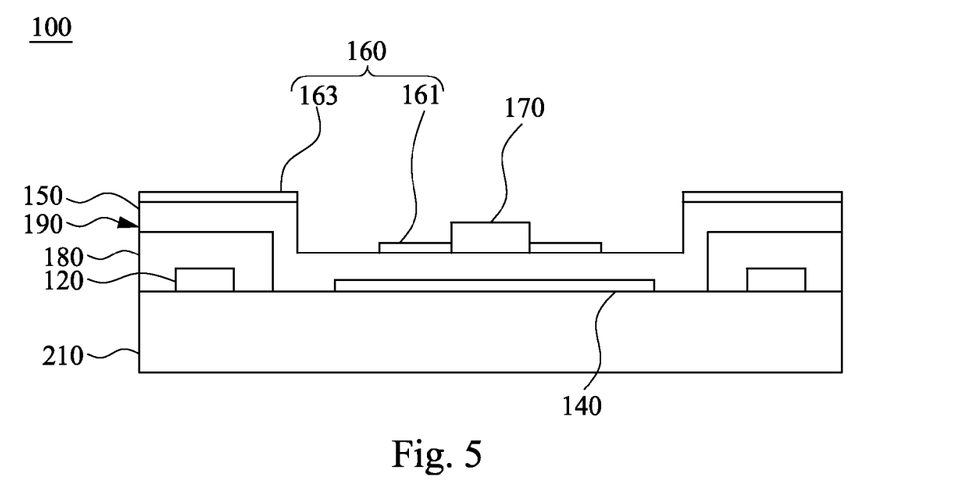
FIG. 5 is a cross-sectional view of the pixel structure according to another embodiment of this invention.

FIG. 5 is a cross-sectional view of the pixel structure 100 according to another embodiment of this invention. The pixel structure 100 can further includes a patterned second dielectric layer 180. The patterned second dielectric layer 180 is at least partially disposed between the data line 120 and the first dielectric layer 150, such that a raised portion 190 is formed on the first dielectric layer 150 and that the second branched electrode 163 at least partially covers the raised portion 190.

By disposing the second branched electrode 163 on the raised portion 190, a parasitic capacitance formed in an area where the second branched electrode 163 overlaps with metal layers is decreased, such that an energy consumption of a source driver chip is decreased. Because positions of the first branched electrode 161 and the pixel electrode 140 do not change, the liquid crystal efficiency is not affected. Specifically, a thickness of the dielectric layer disposed beneath the second branched electrode 163, such as the first dielectric layer 150 and the patterned second dielectric layer 180, is greater than a thickness of the dielectric layer disposed beneath the first branched electrode 161, such as the first dielectric layer 150.

About manufacturing processes of the pixel structure 100 of FIG. 5, first the first substrate 210 is provided, and the pixel electrode 140 and the data line 120 are formed on the first substrate 210. Then, the patterned second dielectric layer 180 is formed on the first substrate 210, and the patterned second dielectric layer 180 covers the data line 120. Then, the first dielectric layer 150 is formed on the first substrate 210, and the first dielectric layer 150 covers the pixel electrode 140 and the patterned second dielectric layer 180. Finally, the first branched electrode 161 and the second branched electrode 163 are respectively formed on the first dielectric layer 150, and the second branched electrode 163 is disposed on the raised portion 190.

Figure 6:
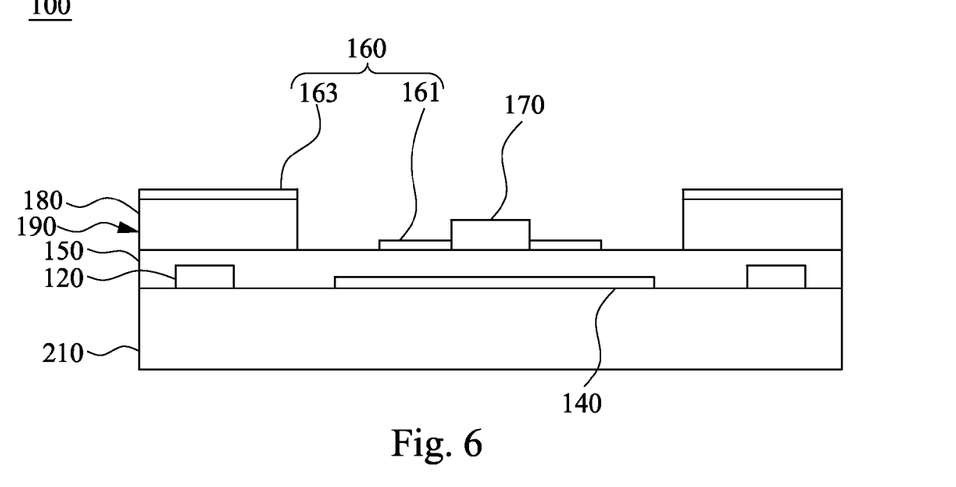
FIG. 6 is a cross-sectional view of the pixel structure according to another embodiment of this invention.

FIG. 6 is a cross-sectional view of the pixel structure 100 according to another embodiment of this invention. The difference of FIG. 5 and FIG. 6 is that the patterned second dielectric layer 180 is disposed on the first dielectric layer 150 and is at least partially disposed between the first dielectric layer 150 and the second branched electrode 163 to form the raised portion 190.

About manufacturing processes of the pixel structure 100 of FIG. 6, first the first substrate 210 is provided, and the pixel electrode 140 and the data line 120 are formed on the first substrate 210. Then, the first dielectric layer 150 is formed on the first substrate 210, and the first dielectric layer 150 covers the pixel electrode 140 and the data line 120. Then, the patterned second dielectric layer 180 is formed on the first dielectric layer 150 to form the raised portion 190. Finally, the first branched electrode 161 is formed on the first dielectric layer 150, and the second branched electrode 163 is formed on the raised portion 190.

Figure 7A:
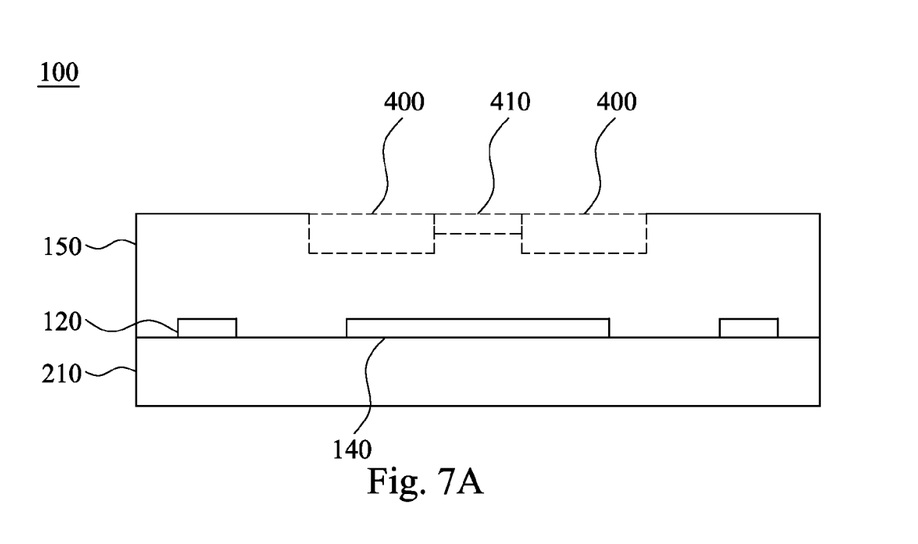
FIG. 7A is a cross-sectional view of the pixel structure before the pixel structure is patterned according to another embodiment of this invention.
Figure 7B:
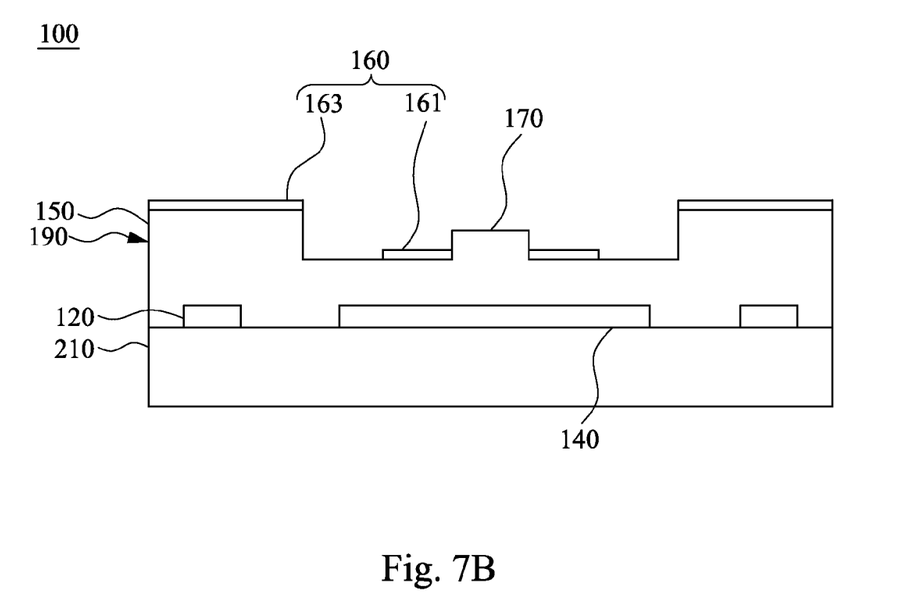
FIG. 7B is a cross-sectional view of the pixel structure of FIG. 7A after the pixel structure is patterned.

FIG. 7A is a cross-sectional view of the pixel structure 100 before the pixel structure 100 is patterned according to another embodiment of this invention. FIG. 7B is a cross-sectional view of the pixel structure 100 of FIG. 7A after the pixel structure 100 is patterned. As shown in FIG. 7B, the first dielectric layer 150 has at least one raised portion 190, the second branched electrode 163 at least partially covers the raised portion 190, and the second branched electrode 163 on the first substrate 210 at least partially overlap with the data line 120 in the projection direction.

About manufacturing processes of the pixel structure 100 of FIG. 7A and FIG. 7B, first the first substrate 210 is provided, and the pixel electrode 140 and the data line 120 are formed on the first substrate 210. Then, the first dielectric layer 150 is formed on the first substrate 210, and the first dielectric layer 150 covers the pixel electrode 140 and the data line 120. Then, the first etching region 400 and the second etching region 410 are respectively etched to form the raised portion 190 and the protrusion 170. Finally, the first branched electrode 161 and the second branched electrode 163 are respectively formed on the first dielectric layer 150, and the second branched electrode 163 is formed on the raised portion 190.

About the protrusion 170 of FIG. 5 and FIG. 6, the protrusion 170 can be formed by the similar manufacturing method of the raised portion 190 of FIG. 5 and FIG. 6. In other words, the protrusion 170 can be formed by forming patterned dielectric layer.

Different branched electrodes of the common electrode 160 such as the first branched electrode 161 and the second branched electrode 163 can be electronically connected to each other. People having ordinary skill in the art can make proper modification to the common electrode 160 according to their actual needs.

Figure 8A:
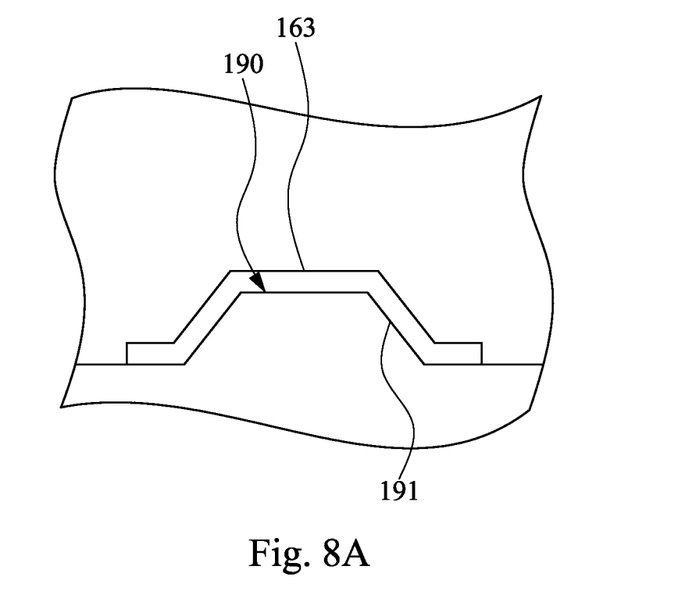
FIG. 8A is a schematic cross-sectional view of the pixel structure when a second branched electrode does not mismatch a raised portion according to one embodiment of this invention.
Figure 8B:
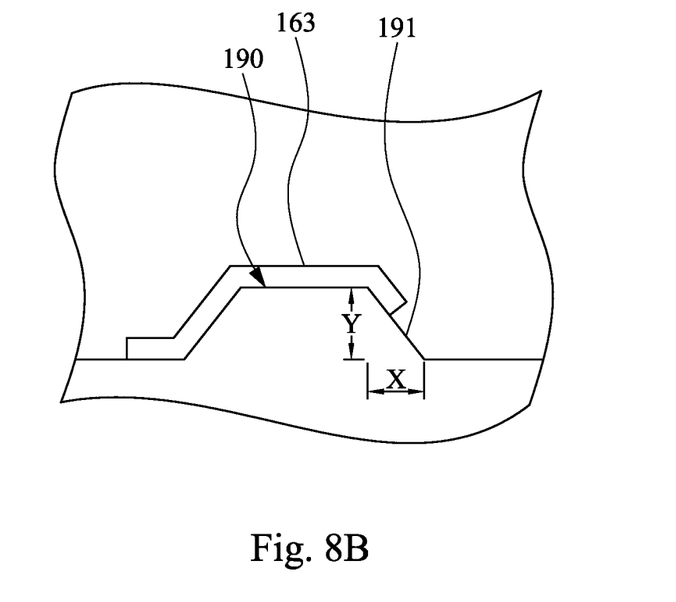
FIG. 8B is a schematic cross-sectional view of the pixel structure when the second branched electrode mismatches the raised portion according to one embodiment of this invention.

FIG. 8A is a schematic cross-sectional view of the pixel structure 100 when the second branched electrode 163 does not mismatch the raised portion 190 according to one embodiment of this invention. FIG. 8B is a schematic cross-sectional view of the pixel structure 100 when the second branched electrode 163 mismatches the raised portion 190 according to one embodiment of this invention. As shown in FIG. 8A, the raised portion 190 (or the patterned second dielectric layer) can have at least one second inclined surface 191, and the second branched electrode 163 at least partially covers the second inclined surface 191.

Figure 9:
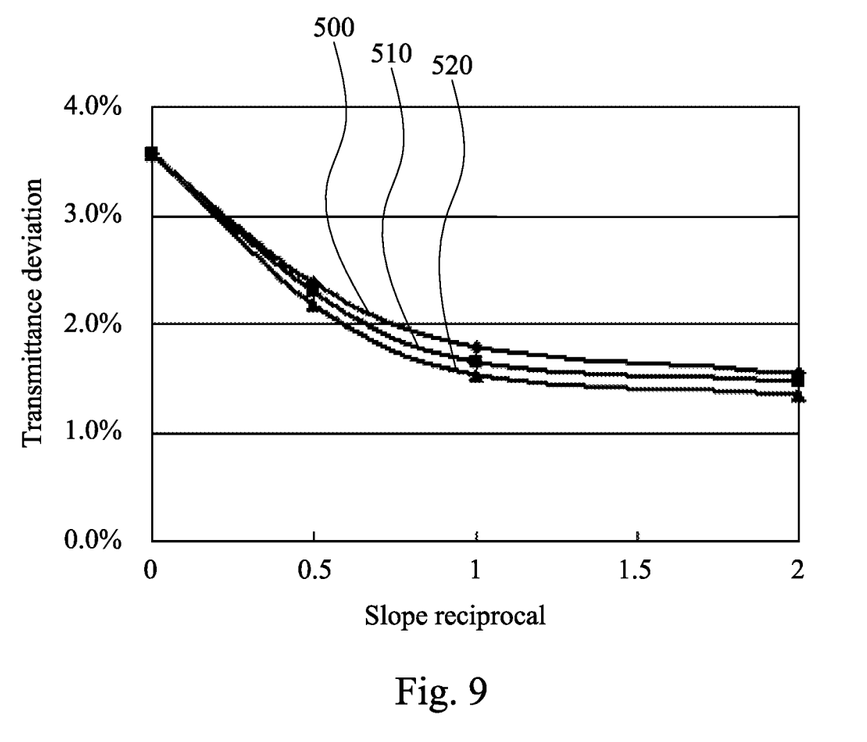
FIG. 9 is a transmittance deviation to slope reciprocal figure according to different embodiments of this invention.

In actual processes, electrodes may mismatch some specific structures as shown in FIG. 8B, these situations lead to a liquid crystal efficiency deviation and thus a transmittance deviation. If the raised portion 190 (or the patterned second dielectric layer) has the second inclined surface 191, the transmittance deviation due to the mismatch can be decreased. The reason is that there are electric fields between the second branched electrode 163 and the pixel electrode 140 (shown in FIG. 1) disposed beneath the first dielectric layer 150 (shown in FIG. 1), and the electric fields change dramatically while the second branched electrode 163 mismatch the raised portion 190 (or the patterned second dielectric layer), while the second inclined surface 191 of the raised portion 190 decreases the change of the electric fields due to the mismatch. If a slope reciprocal X/Y of the second inclined surface 191 is greater than 1, the transmittance deviation due to the mismatch may be further decreased significantly. FIG. 9 is a transmittance deviation to slope reciprocal figure according to different embodiments of this invention. As shown in FIG. 9, a curve 500 represents the transmittance deviation when a height of the raised portion 190 is 200 nm, a curve 510 represents the transmittance deviation when the height of the raised portion 190 is 400 nm, and a curve 520 represents the transmittance deviation when the height of the raised portion 190 is 600 nm. For the curves 500, 510, and 520, the transmittance deviation due to the mismatch is significantly decreased when the slope reciprocal X/Y of the second inclined surface 191 is greater than 1.

By disposing the protrusion 170 between two of the first branched electrodes 161 neighboring to each other, electric fields formed by the common electrode 160 and the pixel electrode 140 become twisted in the display medium layer 170, such that a control efficiency of the display medium layer 170 is increased. In addition, by increasing the thickness of the dielectric layer between the second branched electrode 163 and the data line 120 without changing the thickness of the dielectric layer between the first branched electrode 161 and the pixel electrode 140, the energy consumption of the source driver chip is decreased, and the control efficiency of the display medium layer 170 does not decrease in the same time.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A pixel structure disposed on a substrate, the pixel structure comprising:
    a scan line disposed on the substrate;
    a data line disposed on the substrate;
    an active component electrically connected to the scan line and the data line;
    a pixel electrode disposed on the substrate and electrically connected to the active component;
    a first dielectric layer disposed on the substrate and at least covering the pixel electrode;
    a common electrode at least partially disposed on the first dielectric layer, wherein the common electrode has at least two first branched electrodes and a first opening between the first branched electrodes, and the first branched electrodes and the first opening on the substrate at least partially overlap with the pixel electrode in a projection direction; and
    at least one protrusion disposed on the first dielectric layer, wherein the protrusion is at least partially disposed in the first opening between the first branched electrodes, and the pixel electrode and the protrusion are respectively disposed on two sides of the first dielectric layer.

2. The pixel structure of claim 1, wherein the protrusion has a first surface facing the first dielectric layer, a second surface opposite to the first surface, and a first inclined surface connected to the second surface and the first surface.

3. The pixel structure of claim 2, wherein at least a part of the first branched electrodes conformally covers the first inclined surface.

4. The pixel structure of claim 3, wherein at least a part of the first branched electrodes covers the first dielectric layer.

5. The pixel structure of claim 2, wherein a number of the protrusions is greater than two, at least one of the first branched electrodes is disposed between two of the protrusions neighboring to each other, and the first branched electrode disposed between the two of protrusions neighboring to each other conformally covers the first inclined surfaces of the two of the protrusions neighboring to each other and the first dielectric layer disposed between two of protrusions neighboring to each other.

6. The pixel structure of claim 1, wherein the common electrode further comprises at least one second branched electrode disposed on the first dielectric layer, and the second branched electrode on the substrate at least partially overlaps with the data line in the projection direction.

7. The pixel structure of claim 6, further comprising:
    a patterned second dielectric layer at least partially disposed between the data line and the first dielectric layer, such that a raised portion is formed on the first dielectric layer and that the second branched electrode at least partially covers the raised portion.

8. The pixel structure of claim 7, wherein the raised portion has at least one second inclined surface, and the second branched electrode at least partially covers the second inclined surface.

9. The pixel structure of claim 8, wherein the second inclined surface has a slope reciprocal, and the slope reciprocal is greater than 1.

10. The pixel structure of claim 6, further comprising:
    a patterned second dielectric layer disposed on the first dielectric layer and at least partially disposed between the first dielectric layer and the second branched electrode.

11. The pixel structure of claim 10, wherein the patterned second dielectric layer has at least one second inclined surface, and the second branched electrode at least partially covers the second inclined surface.

12. The pixel structure of claim 6, wherein the first dielectric layer has at least one raised portion, the second branched electrode at least partially covers the raised portion, and the second branched electrode on the substrate at least partially overlap with the data line in the projection direction.

13. The pixel structure of claim 12, wherein the raised portion has at least one second inclined surface, and the second branched electrode at least partially covers the second inclined surface.

14. The pixel structure of claim 6, wherein a thickness of the first dielectric layer disposed beneath the second branched electrode is greater than a thickness of the first dielectric layer disposed beneath the first branched electrode.

15. A display panel, comprising:
- a first substrate;
- a scan line disposed on the first substrate;
- a data line disposed on the first substrate;
- an active component electrically connected to the scan line and the data line;
- a pixel electrode disposed on the first substrate and electrically connected to the active component;
- a first dielectric layer disposed on the first substrate and at least covering the pixel electrode;
- a common electrode at least partially disposed on the first dielectric layer, wherein the common electrode has at least two first branched electrodes and a first opening between the first branched electrodes, and the first branched electrodes and the first opening on the first substrate at least partially overlap with the pixel electrode in the projection direction;
- at least one protrusion disposed on the first dielectric layer, wherein the protrusion is at least partially disposed in the first opening between the first branched electrodes, and the pixel electrode and the protrusion are respectively disposed on two sides of the first dielectric layer;
- a second substrate opposite to the first substrate; and
- a display medium layer disposed between the first substrate and the second substrate.

* * * * *